(12) United States Patent
Dong et al.

(10) Patent No.: US 7,001,810 B2
(45) Date of Patent: Feb. 21, 2006

(54) FLOATING GATE NITRIDATION

(75) Inventors: Zhong Dong, Sunnyvale, CA (US); Chuck Jang, Fremont, CA (US); Ching-Hwa Chen, Milpitas, CA (US)

(73) Assignee: ProMOS Technologies Inc., Hsin Chu (TW)

( * ) Notice: Subject to any disclaimer, the term of this patent is extended or adjusted under 35 U.S.C. 154(b) by 0 days.

(21) Appl. No.: 10/769,025

(22) Filed: Jan. 30, 2004

(65) Prior Publication Data
US 2004/0185647 A1 Sep. 23, 2004

Related U.S. Application Data

(63) Continuation of application No. 10/071,689, filed on Feb. 8, 2002, now abandoned.

(51) Int. Cl.
*H01L 21/336* (2006.01)
*H01L 21/26* (2006.01)

(52) U.S. Cl. ...................... 438/261; 438/513

(58) Field of Classification Search ........ 438/257–267, 438/514–534; 257/324
See application file for complete search history.

(56) References Cited

U.S. PATENT DOCUMENTS

| | | | | |
|---|---|---|---|---|
| 4,450,553 A | | 5/1984 | Holster et al. ............... 369/275 |
| 4,613,956 A | | 9/1986 | Paterson et al. ............. 365/185 |
| 4,644,515 A | | 2/1987 | Allebest et al. ............... 369/32 |
| 4,860,278 A | | 8/1989 | Nakahara ..................... 369/271 |
| 4,960,680 A | | 10/1990 | Pan et al. ..................... 430/346 |
| 5,311,494 A | | 5/1994 | Sugita et al. ................ 369/100 |
| 5,650,344 A | * | 7/1997 | Ito et al. ..................... 438/287 |
| 5,661,056 A | | 8/1997 | Takeuchi ..................... 438/261 |
| 5,703,868 A | | 12/1997 | Kobayashi et al. ......... 369/286 |
| 5,764,619 A | | 6/1998 | Nishiuchi et al. ......... 369/275.1 |
| 5,847,427 A | * | 12/1998 | Hagiwara .................... 257/324 |
| 6,001,713 A | | 12/1999 | Ramsbey et al. ........... 438/520 |
| 6,074,954 A | | 6/2000 | Lill et al. .................... 438/710 |
| 6,127,227 A | * | 10/2000 | Lin et al. ..................... 438/261 |
| 6,140,024 A | * | 10/2000 | Misium et al. .............. 430/314 |
| 6,248,628 B1 | | 6/2001 | Halliyal et al. .............. 438/257 |
| 6,261,903 B1 | | 7/2001 | Chang et al. ................ 438/257 |
| 6,261,973 B1 | * | 7/2001 | Misium et al. .............. 438/775 |
| 6,268,296 B1 | | 7/2001 | Misium et al. .............. 438/763 |
| 6,274,902 B1 | | 8/2001 | Kauffman et al. .......... 257/316 |
| 6,319,775 B1 | | 11/2001 | Halliyal et al. .............. 438/261 |
| 6,362,045 B1 | | 3/2002 | Lin et al. ..................... 438/257 |
| 6,426,305 B1 | | 7/2002 | Chou et al. .................. 438/758 |
| 6,459,126 B1 | * | 10/2002 | Mogami et al. ............. 257/350 |
| 6,653,199 B1 | * | 11/2003 | Zheng ......................... 438/398 |
| 6,721,046 B1 | * | 4/2004 | Halliyal et al. ............ 356/237.5 |
| 2001/0021588 A1 | | 9/2001 | Misium et al. .............. 438/762 |
| 2002/0185675 A1 | | 12/2002 | Furukawa .................... 257/327 |
| 2003/0183869 A1 | | 10/2003 | Crivelli et al. ............... 257/314 |
| 2003/0232507 A1 | | 12/2003 | Chen ........................... 438/763 |

FOREIGN PATENT DOCUMENTS

WO    WO 99/4559    9/1999

OTHER PUBLICATIONS

M. Arai et al., "Remote Plasma Nitridation for Flash Tunnel Oxide," Non-Volatile Semiconductor Memory Workshop 2001, pp. 125-127.

* cited by examiner

*Primary Examiner*—Howard Weiss
*Assistant Examiner*—Marcos D. Pizarro-Crespo
(74) *Attorney, Agent, or Firm*—MacPherson Kwok Chen & Heid LLP; Gideon Gimlan

(57) ABSTRACT

The floating gate, or the oxide between the floating and control gates, or both are nitrided before the control gate layer is deposited.

19 Claims, 3 Drawing Sheets

US 7,001,810 B2

FLOATING GATE NITRIDATION

CROSS REFERENCE TO RELATED APPLICATIONS

The present application is a continuation of, and claims benefit of, U.S. patent application Ser. No. 10/071,689 filed Feb. 8, 2002 mow abandoned, whose entire disclosure is incorporated herein by reference.

BACKGROUND OF THE INVENTION

The present invention relates to integrated circuits, and more particularly to nonvolatile integrated memories.

FIG. 1 shows a cross section of a stacked gate nonvolatile memory cell such as used in flash and non-flash electrically erasable programmable read only memories (EEPROM). Conductive floating gate 110, made of doped polysilicon, overlies monocrystalline silicon substrate 120. Silicon dioxide 130 insulates the floating gate from the substrate. N type source/drain regions 140 in substrate 120 are separated by P type channel region 150. Channel region 150 is directly below the floating gate. Dielectric 160 separates the floating gate from control gate 170 made of doped polysilicon.

The memory cell is read by applying a voltage between the regions 140, applying a voltage between one of the regions 140 and control gate 170, and detecting a current through the other one of the regions 140. The memory cell is written (programmed or erased) by modifying a charge on floating gate 110. Floating gate 110 is completely insulated on all sides. The modify the charge on the floating gate, electrons are transferred between the floating gate and substrate 150 through oxide 130. The electrons can be transferred by Fowler-Nordheim tunneling or hot electron injection. See "Nonvolatile Semiconductor Memory Technology" (1998) edited by W. D. Brown and J. E. Brewer, pages 10–25, incorporated herein by reference. The electron transfer requires a voltage to be established between the floating gate and a substrate region (the substrate region can be channel 150 or a source/drain region 140). This voltage is established by creating a voltage between the substrate region and the control gate. The control gate voltage is coupled to the floating gate. To reduce the voltage required to be created between the substrate region and the control gate, a high capacitive coupling is needed between the floating and control gates. A high specific capacitance (capacitance per unit area) can be obtained between the floating and control gates by reducing the thickness of dielectric 160. However, dielectric 160 functions as a barrier to a charge leakage from the floating gate to the control gate. Therefore, dielectric 160 has to be a high quality, thin, uniform dielectric in order to provide good data retention (low leakage) and ensure a predictable high capacitive coupling between the floating and control gates.

Dielectric 160 can be silicon dioxide. Also, ONO (silicon dioxide, silicon nitride, silicon dioxide) has been used. See U.S. Pat. No. 4,613,956 issued Sep. 23, 1986 to Peterson et al. Another option is a combination of silicon dioxide and oxynitride layers. Thus, according to U.S. Pat. No. 6,274,902, a silicon dioxide layer is thermally grown on floating gate polysilicon, and an oxynitride layer is deposited by LPCVD (low pressure chemical vapor deposition) on the silicon dioxide.

SUMMARY

This section summarizes some features of the invention. The invention is defined by the appended claims that are incorporated into this section by reference.

In some embodiments of the present invention, before the dielectric 160 is formed, the top surface of floating gate 110 is nitrided to incorporate nitrogen atoms. The nitridation may involve ion implantation of pure nitrogen or nitrogen compounds into layer 110. Alternatively, the nitridation can be accomplished by exposing the surface of layer 110 to a nitrogen containing plasma. Other techniques, known or to be invented, are also possible.

After the nitridation process, silicon dioxide is thermally grown on the nitrided surface of layer 110. The nitrogen atoms in layer 110 slow down the oxidation process, so a more uniform silicon dioxide layer with fewer defects can be formed. Optionally, other dielectric layers (e.g. silicon nitride, silicon dioxide, oxynitride) are formed on the thermally grown silicon dioxide layer.

In some embodiments, dielectric 160 includes a top layer of silicon dioxide. The top silicon dioxide layer is nitrided to incorporate nitrogen atoms. The nitrogen atoms may be pure nitrogen or part of nitrogen compounds. The nitrogen atoms reduce the leakage current, thus improving the data retention. Some of the nitrogen may bind with silicon atoms of the silicon oxide layer to form silicon nitride. The silicon nitride has a higher dielectric constant than silicon dioxide, thus increasing the capacitive coupling between the floating and control gates.

Some embodiments combine the features described above, i.e. the nitridation of floating gate 110 and the nitridation of the top silicon dioxide surface of dielectric 160.

The invention is applicable to split gate memories and other flash and non-flash floating gate memories, known or to be invented. Other features of the invention are described below. The invention is defined by the appended claims.

DESCRIPTION OF SOME EMBODIMENTS

Figure 2:
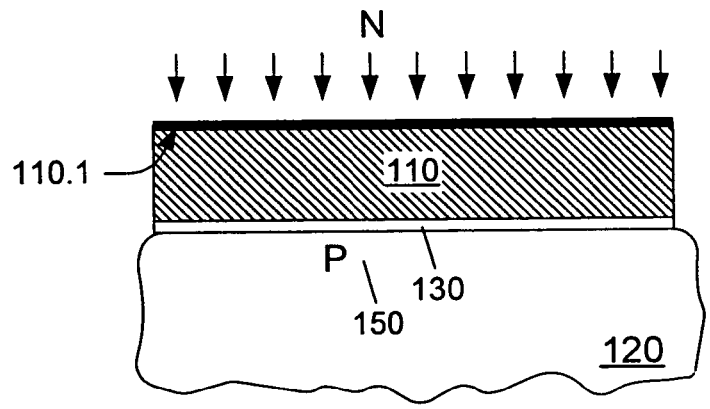
FIGS. 2–7 show cross sections of nonvolatile memory cells in the process of fabrication according to some embodiments of the present invention.

FIG. 2 illustrates a cross section of a nonvolatile memory cell at an early stage of fabrication. Semiconductor substrate 120 (monocrystalline silicon or some other material) is processed to form a suitably doped channel region 150 (type P in FIG. 2, but an N type channel can also be used). Dielectric 130 is formed on substrate 120 over channel 150. Dielectric 130 may be thermally grown silicon dioxide or some other type of dielectric. Then polysilicon layer 110 is deposited and doped during or after deposition. See for example U.S. patent application Ser. No. 09/640,139 filed Aug. 15, 2000 and incorporated herein by reference (now U.S. Pat. No. 6,355,524 issued Mar. 12, 2002).

The top surface of polysilicon 110 is nitrided to incorporate nitrogen atoms. The nitrogen atoms may be pure nitrogen or part of nitrogen compounds. In one embodiment, nitrogen is implanted by ion implantation to a doze of $10^{13}$ to $10^{15}$ atoms/cm$^2$ at an energy 1–30 keV. Optionally, the structure is thermally annealed. In one embodiment, the anneal is performed at 850–1000° C. for 10 to 60 seconds.

In another embodiment, nitridation is performed with plasma. For example, remote plasma nitridation (RPN) can be used. RPN involves exposing the layer 110 to high density nitrogen plasma generated outside of a chamber containing the wafer. See U.S. Pat. No. 6,268,296 and U.S. patent publication 20010021588, both incorporated herein by reference.

In one embodiment, RPN is performed in a system of type Centura® available from Applied Materials, Inc. of Santa Clara, Calif. Suitable process parameters are:

| | |
|---|---|
| Wafer temperature | 300–500° C. |
| Pressure | 1–100 torr |
| Nitrogen (N$_2$) | 0.5 slm (standard liters per minute) to 5 slm |
| Helium (He) | 1–6 slm |
| Time | 10–600 seconds |

Other parameters can also be used.

Optionally, a thermal anneal is conducted. For example, the structure can be held at 900–1100° C. at a pressure of 1 to 500 torr in the atmosphere of any of N$_2$, He, NO, O$_2$, N$_2$O, or a combination of theses gases. An exemplary anneal time is 10–150 seconds.

Another suitable plasma nitridation process is decoupled plasma nitridation (DPN) performed in a machine of type Gate Stack™ Centura® available from Applied Materials, Inc. of Santa Clara, Calif. A similar machine, a Decoupled Plasma Source of type Centura®, is described in U.S. Pat. No. 6,074,954 issued on Jun. 13, 2000 to Lill et al. and incorporated herein by reference. Exemplary process parameters are:

| | |
|---|---|
| Power on the coil outside the processing chamber | 100–500 W |
| Pressure | 10 mTorr to 10 Torr |
| N$_2$ flow | 50 sccm to 2 slm |
| Time | 10–100 seconds |

Optionally, the structure is annealed. The anneal parameters described above for the RPN process are suitable.

After the nitridation step, the exemplary surface concentration of nitrogen atoms is 1–20 atomic percent in some embodiments. The exemplary thickness of the nitrided layer 110.1 at the top of layer 110 is below 3 nm. These parameters are not limiting.

As shown in FIG. 2, the nitridation can be performed before the layer 110 is patterned. Alternatively, the nitridation can be performed after this layer is patterned.

The nitridation can be a blanket process, or a mask can be used to block nitrogen from some wafer regions. In the floating gate regions, both silicon and nitrogen atoms are present at the top surface of layer 110.

Figure 3:
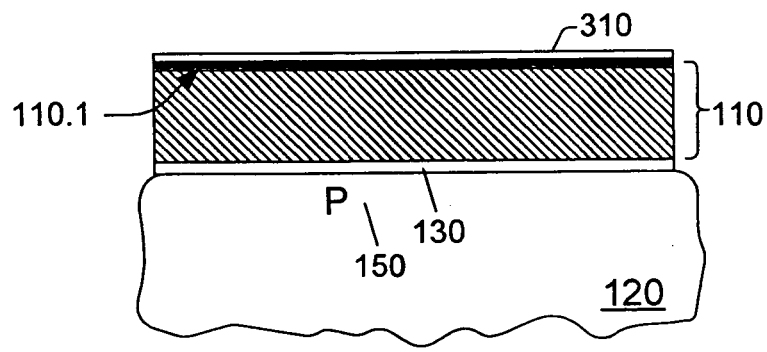

Then silicon dioxide 310 (FIG. 3) is formed by thermal oxidation or chemical vapor deposition (CVD) on the nitrided surface of layer 110. Thermal oxidation can be performed at 800–1050° C. in an oxygen or oxygen/hydrogen atmosphere. In some embodiments, the thermal oxide growth rate is up to 10 times less than for a non-nitrided silicon surface. An exemplary thickness of layer 310 is 3 to 8 nm. Other thicknesses, processes, and process parameters may also be used. FIG. 3 shows the layer 310 to be on top of nitrided layer 110.1. In fact, some or all of the silicon atoms in layer 110.1 can be consumed by the oxidation process. A layer of silicon dioxide with Si$_x$N$_y$ molecules can form as a result.

Figure 4:
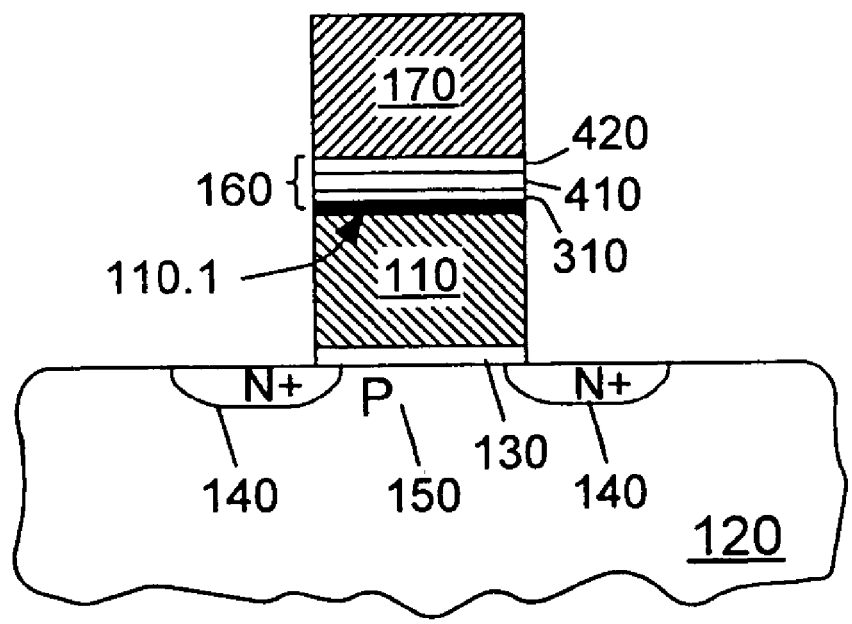

Known techniques can be used to complete the memory fabrication. In the example of FIG. 4, silicon nitride layer 410 is formed by low pressure CVD (LPCVD) on layer 310. Silicon dioxide 420 is deposited by CVD, or thermally grown, on layer 410. Layers 310, 410, 420 are referenced as 160. Doped polysilicon 170, or some other conductive material, is deposited to provide the control gates (possibly wordlines each of which provides the control gates for a row of memory cells). The layers 170, 420, 410, 310, 110, 130 are patterned as needed. Source/drain regions 140 are formed by doping. Additional layers (not shown) may be formed to provide select gates, erase gates, or other features. See the aforementioned U.S. Pat. No. 6,355,524 for an exemplary memory fabrication process that can be modified to incorporate the floating gate nitridation described above.

Figure 5:
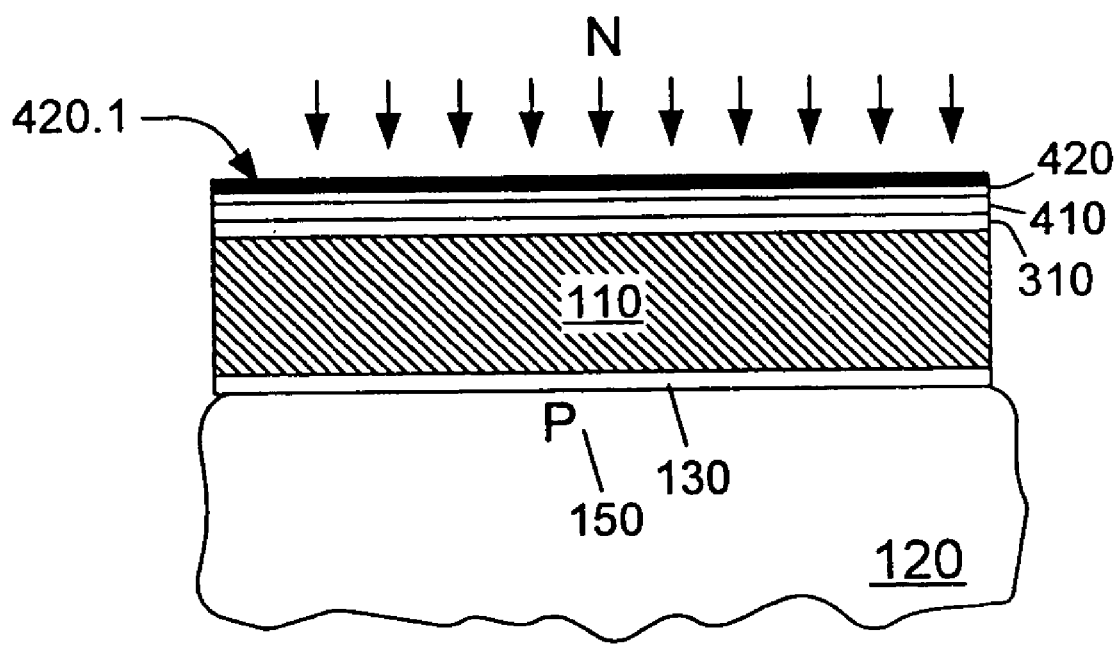

In FIG. 5, the nitridation of floating gate polysilicon 110 is omitted. Silicon dioxide 310 is formed on polysilicon 110 using conventional techniques (e.g. thermal oxidation or CVD). Then silicon nitride 410 is deposited. Silicon dioxide 420 is deposited by CVD or grown thermally on nitride 410. An exemplary thickness of layer 420 is 3–8 nm. Layers 310, 410 can be omitted or replaced with other dielectric layers.

The top surface of oxide 420 is nitrided to improve the data retention. The capacitance is also increased as nitrogen binds with silicon to form silicon nitride. The nitridation can be performed, for example, by ion implantation, RPN or DPN, using the processes described above for nitridation of polysilicon 110. A thermal anneal can be performed at the end of the nitridation as described above for layer 110. In some embodiments, the surface concentration of nitrogen atoms is 1–20 atomic percent, and the thickness of the nitrided layer 420.1 at the top of layer 420 is below 3 nm.

Conductive layer 170 (FIG. 6), for example, doped polysilicon, is formed on the nitrided surface of oxide 420 as described above in connection with FIG. 4. This layer will provide the control gate. The structure is patterned and the fabrication is completed as described above in connection with FIG. 5.

Figure 6:
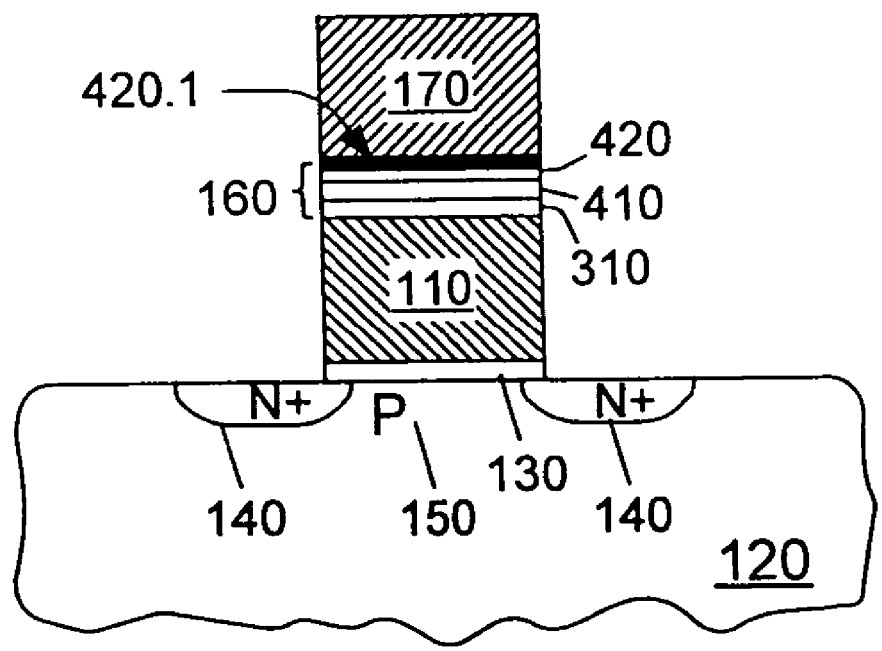
Figure 7:
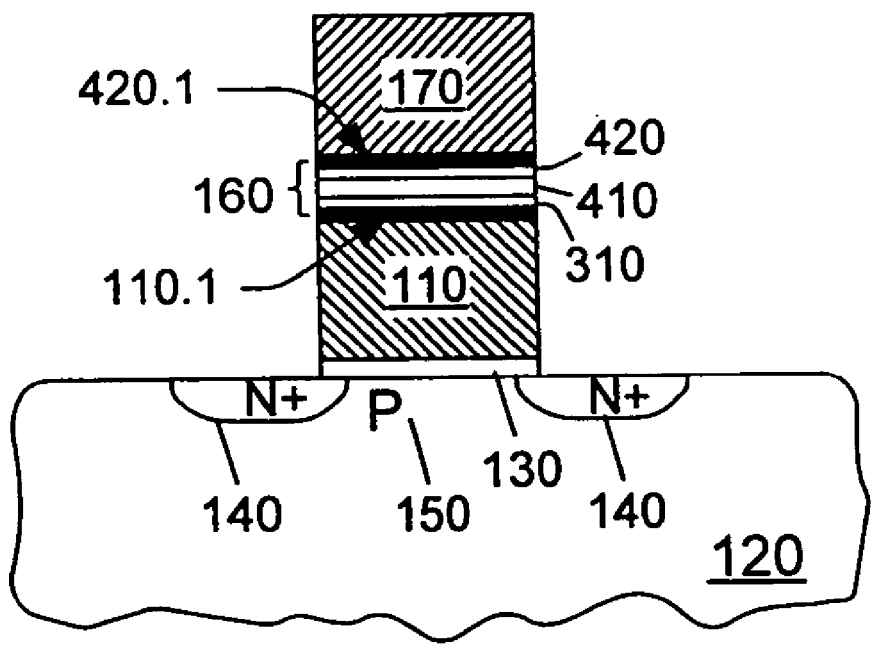

In FIG. 7, the techniques of FIGS. 2–6 are combined. Floating gate polysilicon 110 is nitrided as described above in connection with FIG. 2. Then one or more dielectric layers are deposited (e.g. oxide 310, nitride 410, and oxide 420), with the top layer being silicon dioxide. The top silicon dioxide layer 420 is nitrided as described above in connection with FIG. 5. Then conductive layer 170 is formed and the fabrication is completed as described above.

Nitridation of floating gate polysilicon 110 and/or silicon dioxide 420 does not lead to a significant change in the total physical thickness of dielectric 160. However, the specific capacitance between the floating and control gates increases by 5 to 20% in some embodiments depending on the nitridation conditions. Other capacitance parameters can also be obtained.

Figure 1:
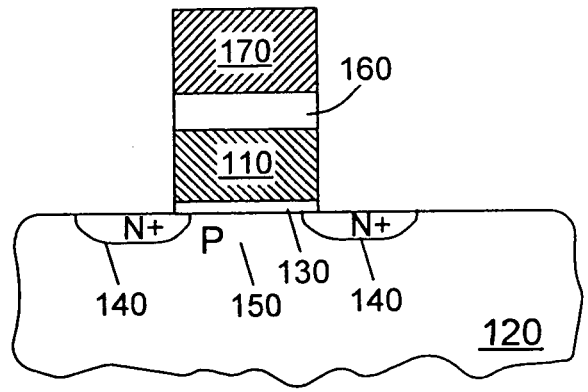
FIG. 1 shows a cross section of a prior art nonvolatile memory cell.

The memory cells of FIGS. 4, 6, 7 can be operated like the memory cell of FIG. 1. The memory can be programmed by Fowler-Nordheim tunneling of electrons from channel 150 or source/drain region 140 to floating gate 110. The memory can be erased by Fowler-Nordheim tunneling of electrons from the floating gate to channel 150 or a source/drain region 140. In other embodiments, the memory is programmed by hot electron injection, and erased by Fowler-Nordheim tunneling. In still other embodiments, the memory is erased by tunneling of electrons from the floating gate to a separate erase gate (not shown). Other memory structures, including split gate structures with select gates, and other programming and erase mechanisms, known or to be invented, can also be used.

The invention is not limited to the embodiments described above. The invention is not limited to the particular nitridation techniques or process parameters, layer thicknesses, or other details. The invention is not limited to the particular shape of the floating and control gates or their positioning relative to each other. The invention is not limited to particular materials. For example, polysilicon 110 can be replaced with amorphous silicon, monocrystalline silicon, or their combinations. Silicon dioxide ($SO_2$) can be replaced, or mixed with, silicon monoxide (we will use the term "silicon oxide" to refer both to silicon dioxide and silicon monoxide). Other embodiments and variations are within the scope of the invention, as defined by the appended claims.

What is claimed is:

1. A method for manufacturing an integrated circuit comprising a nonvolatile memory, the method comprising:
    (a) forming a conductive first layer containing primarily silicon, the first layer being to provide one or more floating gates for the nonvolatile memory;
    (b) nitriding a silicon-containing surface of the first layer with a low temperature, low energy, surface nitriding process such as Remote Plasma Nitridation (RPN) or Decoupled Plasma Nitridation (DPN) so as to incorporate nitrogen atoms into said silicon-containing surface of the first layer at relatively low temperature and relatively low energy;
    (c) subjecting the nitrided surface to a thermally oxidizing atmosphere so as to thereby form a thermally-grown silicon oxide at the nitrided surface, the combination of the thermally-grown silicon oxide and incorporated nitrogen atoms defining at least part of a first dielectric of the nonvolatile memory; and
    (d) forming a conductive second layer separated by the first dielectric from conductive material of the first layer, the conductive second layer providing one or more control gates for the nonvolatile memory.

2. The method of claim 1 wherein forming the silicon oxide at the nitrided surface comprises performing oxidation at a temperature in the range 800° C.–1050° C. in an oxygen or oxygen/hydrogen atmosphere to thereby form the silicon oxide by thermal oxidation.

3. The method of claim 1 wherein the surface of the first layer is a polysilicon surface.

4. The method of claim 1 wherein the nitriding step includes using a Remote Plasma Nitridation (RPN) process.

5. The method of claim 1 wherein the nitriding step includes using a Decoupled Plasma Nitridation (DPN) process.

6. The method of claim 1 wherein the nitriding step provides a concentration of nitrogen atoms of 1–20 atomic percent in the nitrided surface.

7. The method of claim 6 wherein the nitriding step incorporates said nitrogen atoms to a depth of no more than 3 nm in said surface of the first layer.

8. The method of claim 1 wherein said first layer is disposed over a tunneling dielectric.

9. The method of claim 8 and further comprising: thermally growing the tunneling dielectric.

10. The method of claim 1 and further comprising: depositing a silicon nitride layer on said combination of the thermally-grown silicon oxide and incorporated nitrogen atoms to thereby define a further part of the first dielectric of the nonvolatile memory.

11. The method of claim 10 and further comprising: depositing a silicon oxide layer on said deposited silicon nitride layer to thereby define a yet further part of the first dielectric of the nonvolatile memory.

12. A method of manufacturing a nonvolatile memory cell within a monolithically integrated circuit, the method comprising:
    (a) forming a tunneling dielectric layer on a semiconductive substrate;
    (b) forming a floating gate layer on said tunneling dielectric layer, the floating gate layer having a top surface composed primarily of conductive silicon;
    (c) surface nitridating said top surface of the floating gate layer with a low temperature, low energy process such as Remote Plasma Nitridation (RPN) or Decoupled Plasma Nitridation (DPN) so as to incorporate nitrogen atoms into said top surface of the floating gate layer at relatively low temperature and relatively low energy; and
    (d) subjecting the nitrided top surface to a thermally oxidizing atmosphere so as to thereby form a combination of thermally-grown silicon oxide and surface incorporated and thermally treated nitrogen atoms at the nitrided and thermally oxidized top surface of the floating gate layer.

13. The memory cell manufacturing method of claim 12 and further wherein:
    (d.1) said subjecting of the nitrided top surface to the thermally oxidizing atmosphere consumes at least silicon atoms from the nitrided top surface to form thermally grown silicon dioxide at the top of the nitrided and thermally oxidized top surface.

14. The memory cell manufacturing method of claim 12 and further wherein:
    said surface nitridating step incorporates nitrogen atoms into the said top surface of the floating gate layer to a depth of less than 3 nm.

15. The memory cell manufacturing method of claim 12 and further comprising:
    (e) depositing a silicon nitride layer directly on the nitrided and thermally oxidized top surface of the floating gate layer.

16. The memory cell manufacturing method of claim 15 and further wherein:
    (d.1) said subjecting of the nitrided top surface to the thermally oxidizing atmosphere consumes at least silicon atoms from the nitrided top surface to form thermally grown silicon dioxide at the top of the nitrided and thermally oxidized top surface.

17. The memory cell manufacturing method of claim 15 and further comprising:
    (f) depositing a silicon oxide layer directly on the silicon nitride layer.

18. The memory cell manufacturing method of claim 17 and further comprising:
    (g) surface nitridating said deposited silicon oxide layer with a low temperature, low energy process such as Remote Plasma Nitridation (RPN) or Decoupled Plasma Nitridation (DPN) so as to incorporate nitrogen atoms into said deposited silicon oxide layer at relatively low temperature and relatively low energy.

19. The memory cell manufacturing method of claim 18 and further comprising:
    (h) forming a conductive gate layer on said surface nitridated and deposited silicon oxide layer.

* * * * *